(12) United States Patent
Cong et al.

(10) Patent No.: US 7,247,555 B2
(45) Date of Patent: Jul. 24, 2007

(54) METHOD TO CONTROL DUAL DAMASCENE TRENCH ETCH PROFILE AND TRENCH DEPTH UNIFORMITY

(75) Inventors: Hai Cong, Singapore (SG); Yong Kong Siew, Sungai Pelek (MY); Liang Choo Hsia, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 76 days.

(21) Appl. No.: 10/767,292

(22) Filed: Jan. 29, 2004

(65) Prior Publication Data

US 2005/0170625 A1    Aug. 4, 2005

(51) Int. Cl.
*H01L 21/4763* (2006.01)
*H01L 21/44* (2006.01)

(52) U.S. Cl. ............... 438/622; 438/624; 438/637; 438/638; 438/639; 438/671; 438/672; 438/687; 438/597; 257/E21.555; 257/E21.257; 257/E21.546; 257/E21.259; 257/E21.303

(58) Field of Classification Search ......... 438/622, 438/624, 637–639, 671–672, 687, 597
See application file for complete search history.

(56) References Cited

U.S. PATENT DOCUMENTS

| | | | |
|---|---|---|---|
| 6,309,962 B1 | 10/2001 | Chen et al. | 438/638 |
| 6,472,306 B1 | 10/2002 | Lee et al. | 438/623 |
| 6,603,204 B2 | 8/2003 | Gates et al. | 257/760 |
| 6,605,874 B2 | 8/2003 | Leu et al. | 257/758 |
| 2003/0176058 A1* | 9/2003 | Weidman et al. | 438/638 |
| 2005/0110152 A1* | 5/2005 | Wang et al. | 257/760 |
| 2005/0186782 A1* | 8/2005 | Burke et al. | 438/638 |

* cited by examiner

*Primary Examiner*—Michael Lebentritt
*Assistant Examiner*—Mohsen Ahmadi

(57) ABSTRACT

A method of forming trench openings in a dual damascene trench and via etch process by using a two component hard mask layer, termed a bi-layer, over different intermetal dielectrics, IMD, to solve dual damascene patterning problems, such as, fencing and sub-trench formation. Via first patterning in dual damascene processing is one of the major integration schemes for copper backend of line (BEOL) integration. Via first dual damascene scheme usually uses a hard mask layer deposited on top of an inter-metal dielectric (IMD) film stack. The dual damascene trench etch requires uniform trench depth across wafer after etch. In addition, via top corner profiles need to be well maintained without any fencing or faceting. The present method solves these problems by using a two component hard mask layer, termed a bi-layer, deposited directly on top of an inter-metal dielectric (IMD) film stack.

30 Claims, 4 Drawing Sheets

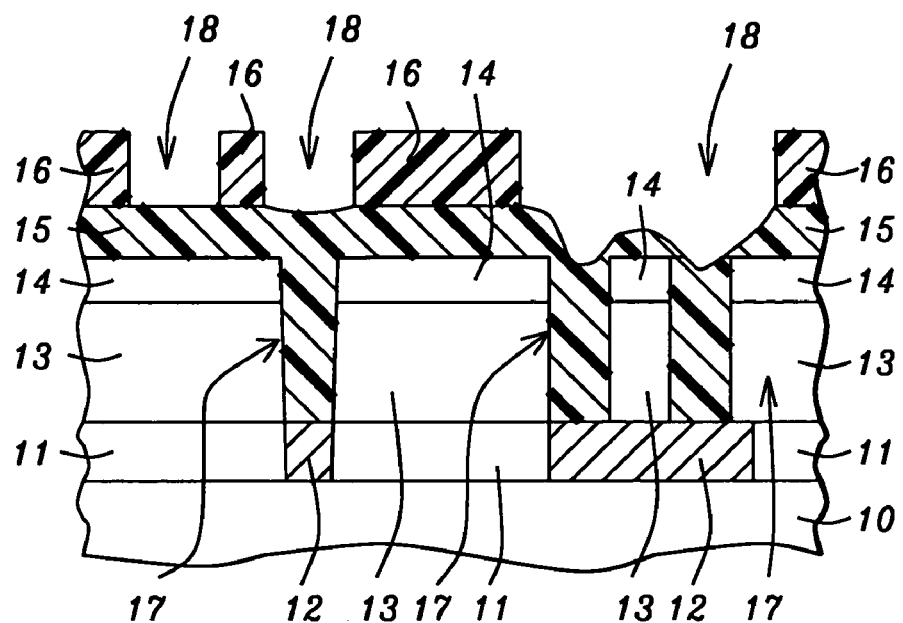
*FIG. 1A – Prior Art*
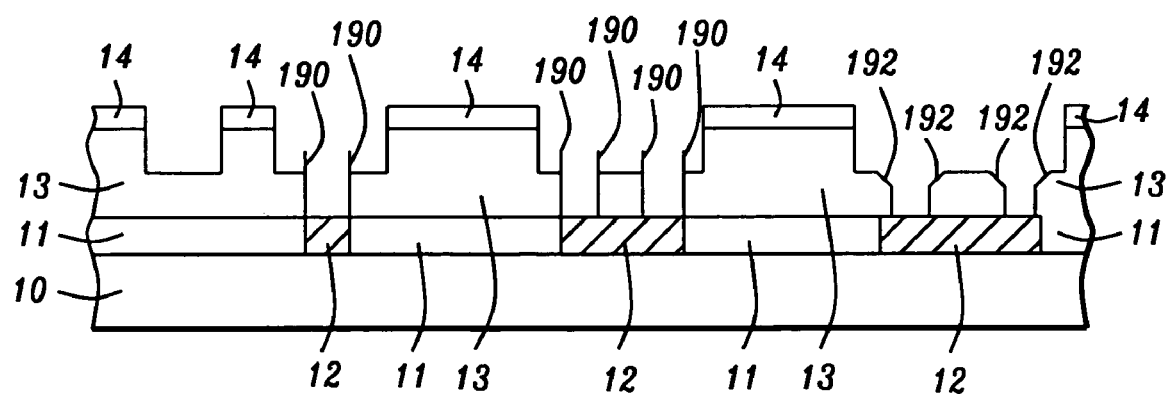
*FIG. 1B – Prior Art*

METHOD TO CONTROL DUAL DAMASCENE TRENCH ETCH PROFILE AND TRENCH DEPTH UNIFORMITY

BACKGROUND OF THE INVENTION (1) Field of the Invention

The present invention teaches a method of forming trench openings in a dual damascene trench and via etch process by using a two component hard mask layer, termed a bi-layer, over different intermetal dielectrics, IMD, to solve dual damascene patterning problems, such as, fencing and sub-trench formation.

(2) Description of Related Art

Related patents and relevant literature now follow as Prior Art.

U.S. Pat. No. 6,603,204 B2 entitled "Low-K Interconnect Structure Comprised of a Multilayer of Spin-On Porous Dielectrics" granted Aug. 5, 2003 to Gates et al. describes a two layer hard mask structure, but lacks processing details for forming a low-k dielectric metal conductor interconnect structure having no micro-trenches present therein. Specifically, the above structure is achieved by providing an interconnect structure which includes at least a multilayer of dielectric materials which are applied sequentially in a single spin apply tool and then cured in a single step and a plurality of patterned metal conductors within the multilayer of spun-on dielectrics. The interconnect structure also includes a hard mask which assists in forming the interconnect structure of the dual damascene-type. The first and second composition are selected to obtain etch selectivity of at least 10 to 1 or higher, and are selected from specific groups of porous low-k organic or inorganic materials with specific atomic compositions.

U.S. Pat. No. 6,309,962 B1 entitled "Film Stack and Etching Sequence for Dual Damascene" granted Oct. 30, 2001 to Chen et al. teaches that two or three layers of hard mask are not needed in this process using an etch stop layer. A process for forming a dual damascene cavity in a dielectric, particularly a low k organic dielectric, is described. The dielectric is composed of two layers separated by an etch stop layer. Formation of the damascene cavity is achieved by using a hard mask that is made up of two layers of silicon oxynitride separated by layer of silicon oxide. For both the trench first and via first approaches, the first cavity is formed using only the upper silicon oxynitride layer as the mask. Thus, when the second portion is patterned, little or no misalignment occurs because said upper layer is relatively thin. Additional etching steps result in a cavity and trench part that extend as far as the etch stop layer located between the dielectric layers. Final removal of photoresist occurs with a hard mask still in place so no damage to the organic dielectric occurs. A final etch step then completes the process.

U.S. Pat. No. 6,605,874 B2 entitled "Method of Making Semiconductor Device Using an Interconnect" granted Aug. 12, 2003 to Leu et al. discloses a multiple hard mask layer process with no etch stop layer. The invention includes an embodiment that relates to method of forming an interconnect. The method includes the effect of reducing electromigration in a metallization. An article achieved by the inventive method includes a first interconnect disposed above a substrate; a first conductive diffusion barrier layer disposed above and on the first interconnect; an upper interconnect, that is either landed or unlanded and that is disposed above the first interconnect; and an upper conductive diffusion barrier layer disposed above and on the upper interconnect.

U.S. Pat. No. 6,472,306 B1 entitled "Method of Forming a Dual Damascene Opening Using CVD Low-K Material and Spin-On-Polymer" granted Oct. 29, 2002 to Lee et al. describes a single hard mask layer and no etch stop layer. Specifically, a method of forming a dual damascene opening, consisting of the following steps: a semiconductor structure having at least one exposed metal line is provided. A spin-on-polymer layer is formed over the semiconductor structure and the metal line. A CVD low-k material layer is formed over the spin-on-polymer layer. The CVD low-k material layer is patterned to form a CVD low-k material layer via over the metal line. The spin-on-polymer layer is patterned to form a spin-on-polymer layer via opening continuous and contiguous with the CVD low-k material layer via and exposing a portion of the metal line. The CVD low-k material layer adjacent the CVD low-k material layer via is patterned to form a CVD low-k material layer trench. The spin-on-polymer layer via opening and the CVD low-k material layer trench forming a dual damascene opening.

SUMMARY OF THE INVENTION

The present invention teaches a method of forming trench openings in a dual damascene trench and via etch process by using a two component hard mask layer, termed a bi-layer, over different intermetal dielectrics, IMD, to solve dual damascene patterning problems, such as, fencing and sub-trench formation. A via first patterning in dual damascene processing is one of the major integration schemes for copper backend of line (BEOL) integration. A via first dual damascene scheme usually uses a hard mask layer deposited on top of an inter-metal dielectric (IMD) film stack. A key point, is that the dual damascene trench etch requires uniform trench depth across wafer after etch. In addition, via top corner profiles need to be well maintained without severe fencing or faceting. The present invention solves these problems by using a two component hard mask layer, termed a bi-layer, deposited directly on top of an inter-metal dielectric (IMD) film stack.

The solution to the above processing problems is the following list of two component hard masks, termed bi-layer hard masks. Processing details of the trench etch are as follows. The film stack is comprised of a bi-layer hard mask termed, Top HM1, Bottom HM2, and IMD. The combination of HM1/HM2/IMD stack, inter-metal dielectric consists of, which can be any one of these schemes:

| HM1  | HM2         | IMD                                    |
|------|-------------|----------------------------------------|
| USG/ | SiC or SiN/ | Fluorine doped Oxide or $SiO_2$        |
| USG/ | SiC/        | Carbon-doped Oxide                     |
| USG/ | SiC/        | Organic based low-k                    |
| USG/ | SiC/        | porous low-k                           |

The etch considerations for the above bi-layer hard mask are as following:

a) selective BARC, bottom anti-reflective coating, opening etch stops on the HM1, top hard mask layer, USG, undoped silicate glass b) selective HM1 etch to stop on HM2, bottom hard mask layer (3-5× Selectivity)

c) via-fill material recess to control fence or sub-trench profile, which can be performed after BARC opening and/or after HM1 etch above d) 1:1 selectivity chemistry for HM2, bottom hard mask and IMD, inter-metal dielectric, film The final etch process is comprised of a 1:1 selectivity etch chemistry for HM2 and IMD film, intermetal dielectric, can be used since HM2, bottom hard mask layer etch properties are not much different from the IMD film. This 1:1 selectivity chemistry can be used for etching HM2, as well as, the IMD film.

This invention has been summarized above and described with reference to the preferred embodiments. Some processing details have been omitted and are understood by those skilled in the art. More details of this invention are stated in the "DESCRIPTION OF THE PREFERRED EMBODIMENTS" section.

BRIEF DESCRIPTION OF THE DRAWINGS

The object and other advantages of this invention are best described in the preferred embodiments with reference to the attached drawings that include:

FIGS. 1A-B, which in cross-sectional representation, illustrates Prior Art methods, as background to the present invention, forming a defective dual damascene structure of via and trench over a copper interconnect.

DESCRIPTION OF THE PREFERRED EMBODIMENT

Figure 2A:
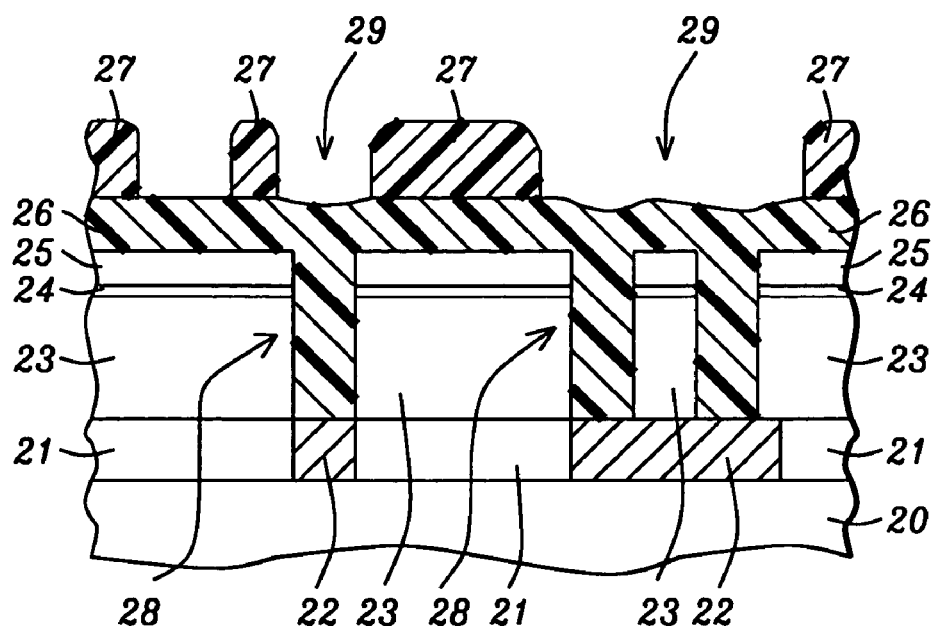
FIGS. 2A-F, which illustrated in cross-sectional drawing, are the key process steps for forming a dual damascene structure of via and trench over a copper interconnect, using a two component hard mask layer, termed a bi-layer, over different intermetal dielectrics, IMD, forming metal contacts and interconnect wiring.

The present invention describes a method of forming trench openings in a dual damascene trench and via etch process by using a two component hard mask layer, termed a bi-layer, over different intermetal dielectrics, IMD, to solve dual damascene patterning problems, such as, fencing and sub-trench formation. Defining a "via first" pattern in dual damascene processing, is one of the major integration schemes for copper backend of line (BEOL) integration. A via first dual damascene scheme usually uses a hard mask layer deposited on top of an inter-metal dielectric (IMD) film stack. A key point is that the dual damascene trench etch requires uniform trench depth across wafer after etch. In addition, via top corner profiles need to be well maintained without severe fencing or faceting. The present invention solves these problems by using a two component hard mask layer, termed a bi-layer, deposited directly on top of an inter-metal dielectric (IMD) film stack.

The solution to the above processing problems is the following list of two component hard masks, termed bi-layer hard masks. The film stack is comprised of a bi-layer hard mask termed, Top HM1, Bottom HM2, and IMD. The combination of HM1/HM2/IMD stack, inter-metal dielectric consists of, which can be any one of these schemes:

| HM1 | HM2 | IMD |
|---|---|---|
| USG/ | SiC or SiN/ | Fluorine doped Oxide or SiO$_2$ |
| USG/ | SiC/ | Carbon-doped Oxide |
| USG/ | SiC/ | Organic based low-k dielectric |
| USG/ | SiC/ | porous low-k dielectric |

The etch considerations for the above bi-layer hard masks are as following:

a) selective BARC, bottom anti-reflective coating, opening etch stops on the HM1, top hard mask layer, USG, undoped silicate glass b) selective HM1 etch to stop on HM2, bottom hard mask layer (3-5× Selectivity)

c) via-fill material recess to control fence or sub-trench profile, which can be performed after BARC opening and/or after HM1 etch above d) 1:1 selectivity chemistry for HM2, bottom hard mask and IMD, inter-metal dielectric, film The final etch process is comprised of a 1:1 selectivity etch chemistry for HM2 and IMD film, intermetal dielectric, can be used since HM2, bottom hard mask layer etch properties are not much different from the IMD film. This 1:1 selectivity chemistry can be used for etching HM2, as well as, the IMD film.

Referring to FIG. 1A illustrated in cross-sectional drawing, as background and provided by Prior Art methods is a dual damascene build structure utilizing only a single hard mask layer 14. In FIG. 1A, a semiconductor substrate 10 is sketched with an insulating layer 11 on the substrate 10. A copper metal interconnect 12 is shown patterned within the insulating layer 11, e.g., SiO$_x$. In addition, a second insulating layer, 13, an IMD, inter-metal dielectric film, is deposited and patterned with via openings 17 (arrows). Also provided by Prior Art methods, are just one hard mask layer 14, over the IMD 13. A via fill photoresist 15 is provided as a bottom anti-reflective coating, BARC. Subsequent trench openings 18 (arrows) are patterned by photoresist 16.

Referring to FIG. 1B illustrated in cross-sectional drawing, as background and provided by Prior Art methods to is a defective dual damascene structure that is the end result after etching of using only a single hard mask layer. The defects that are illustrated in FIG. 1B are primarily two types: fencing 190 or "crowning" occurs around the openings, and faceting of via corners, or sub-trench formation (192) occurs.

Referring to FIGS. 2A-F which illustrated in cross-sectional drawing, are the key process steps for forming a dual damascene structure of via and trench over a copper interconnect, using a two component hard mask layer, termed a bi-layer, over different intermetal dielectrics, IMD, forming metal contacts and interconnect wiring. The processing is similar to conventional dual damascene build with the key exception that a two component hard mask is used. In FIG. 2A, a semiconductor substrate 20 is sketched with an insulating layer 21 on the substrate 20. A copper metal interconnect 22 is shown patterned within the insulating layer 21, e.g., SiO$_x$. In addition, a second insulating layer, 23, an IMD, inter-metal dielectric film, together with a bi-layer hard mask, is deposited and patterned with via openings 28 (arrows). The key processing step is that now two hard mask layers, 24 and 25 are deposited over the IMD. Via openings 28 (arrows) are defined and the vias are filled with photoresist 26, provided as a bottom anti-reflective coating, BARC. Subsequent trench openings 29 (arrows) are patterned by photoresist 27.

The processing details of the trench etch are as follows: The film stack is comprised of a bi-layer hard mask termed, Top HM1, and Bottom HM2, and a inter-metal dielectric layer, IMD, under the bilayer hard mask. Therefore, the combination of HM1/HM2/IMD stack consists of, which can be any one of these schemes:

| HM1 | HM2 | IMD |
|---|---|---|
| USG/ | SiC or SiN/ | Fluorine doped Oxide or $SiO_2$ |
| USG/ | SiC/ | Carbon-doped Oxide |
| USG/ | SiC/ | Organic based low-k dielectric |
| USG/ | SiC/ | porous low-k dielectric |

(Note: USG, is undoped silicate glass for the HM1 layer, hard mask top layer, and can also be a conventional $SiO_2$ film of thickness in the range from 1000 to 2000 Angstroms.)

To be more clear, as to the insulating layer and intermetal dielectric layer materials, they are comprised of: silicon dioxide, silicon oxide, undoped silicate glass, Fluorine doped Oxide, Carbon-dope Oxide, Organic based low-k dielectric, and porous low-k dielectric, where the IMD, inter-metal dielectric, film thickness is in a range approximately from 0.2 to 2 microns. Furthermore, the bi-layered hard mask is comprised of the following sets of two layered materials:

| HM1 | HM2 |
|---|---|
| USG/ | SiC or SiN |
| USG/ | SiC |
| USG/ | SiC |
| USG/ | SiC | wherein USG, is undoped silicate glass for HM1 layer, and is the hard mask top layer, which can be a conventional $SiO_2$ film, of thickness in the range from 1000 to 2000 Angstroms. The HM2, is the hard mask bottom layer, and which is a dielectric layer with etch selectivity of ~3-5 for HM1 etch, and therefore, the HM1 etch stops on this bottom HM2 layer.

Figure 2B:
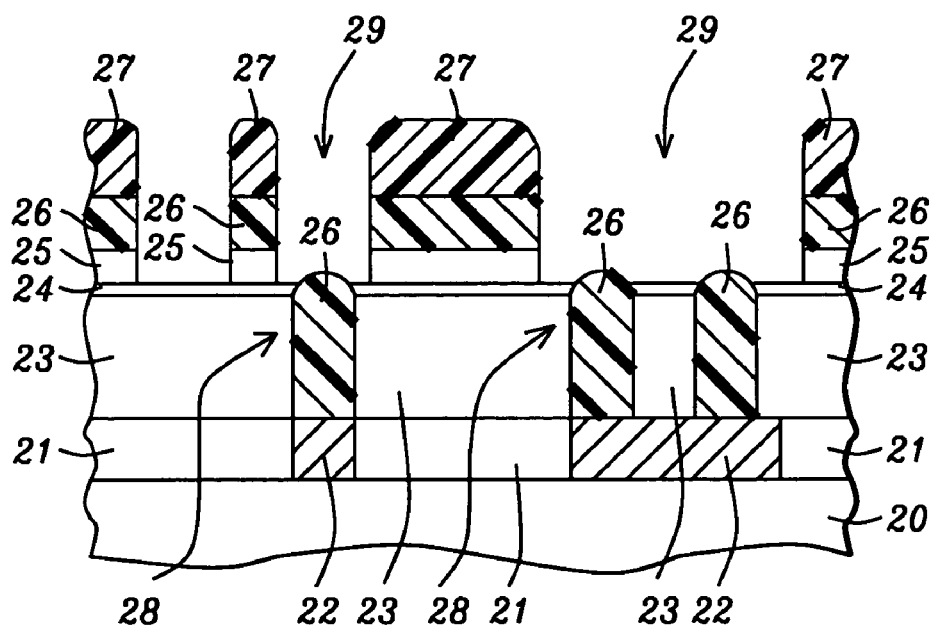
Figure 2C:
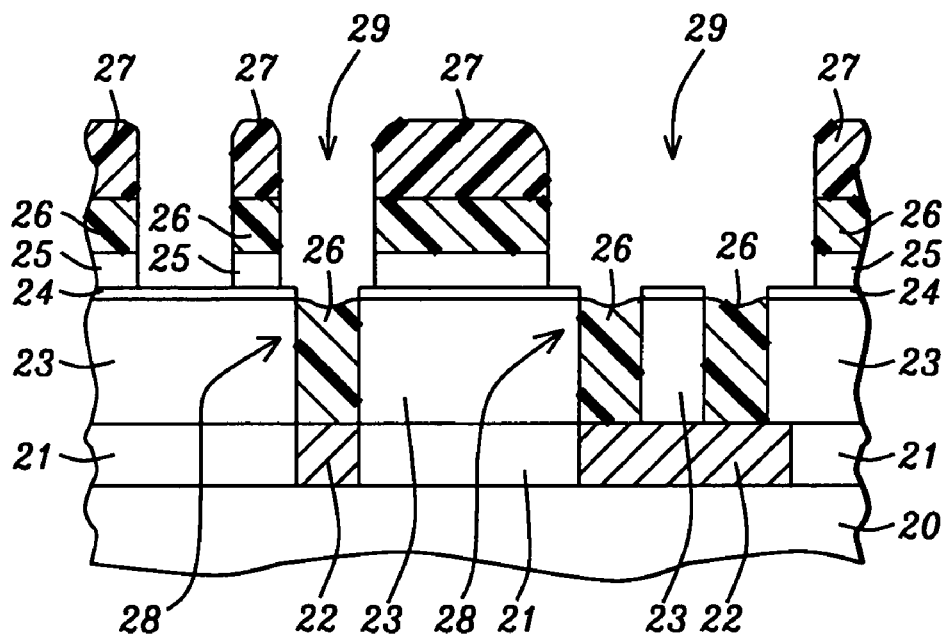
Figure 2D:
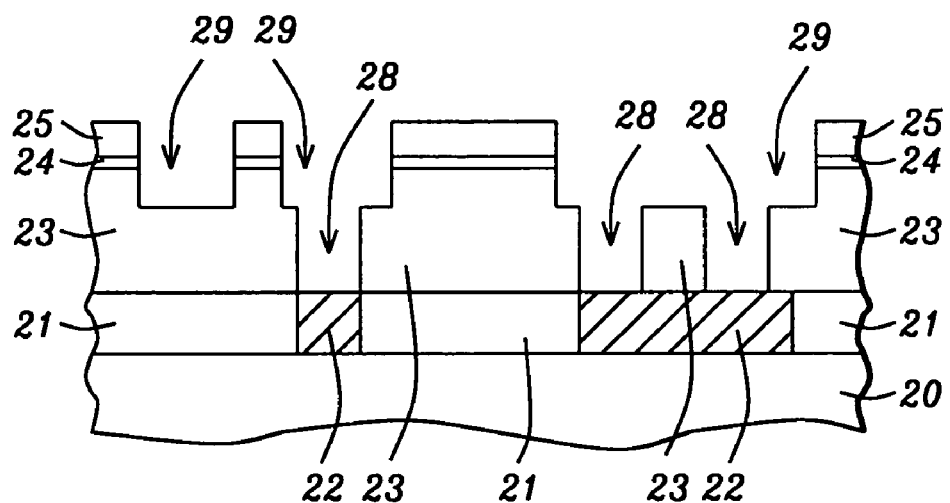

Referring to FIGS. 2B-D which illustrated in cross-sectional sectional drawing, are the profiles after different trench etch steps. In FIG. 2B, via fill material, organic material or photoresist 26, thickness from 500 to 3,000 Angstroms, provided as a bottom anti-reflective coating, BARC, is at a higher level after hard mask 1 etch. In FIG. 2C, the via fill material 26, is further etched back to a recess step profile. In FIG. 2D, all the trench etch steps are completed. This results in open vias 28 (arrows) and open trenches 29 (arrows), ready for metal fill, again referring to FIG. 2D.

The etch considerations for the above bi-layer hard masks are as following:
a) selective BARC, bottom anti-reflective coating, opening etch stops on the HM1, top hard mask layer, USG, undoped silicate glass
b) selective HM1 etch to stop on HM2, bottom hard mask layer (3-5× Selectivity)
c) via-fill material recess to control fence or sub-trench profile, which can be performed after BARC opening and/or after HM1 etch above
d) 1:1 selectivity chemistry for HM2, bottom hard mask and IMD, inter-metal dielectric, film The HM1 layer, hard mask top layer, can be a conventional $SiO_2$ film of thickness in the range from 1000 to 2000 Angstroms, and HM2, hard mask bottom layer, is a selective dielectric layer (Selectivity of ~3-5) for HM1 etch, with etch stop on HM2. The HM2 can be very thin, between approximately 300 to 600 Angstroms. The advantage of this bi-layer hard mask is to reduce etch defects and trench depth non-uniformity. Both hard mask layers, HM1 and HM2, can be removed by the subsequent copper chemical mechanical polish if necessary. The IMD, inter-metal dielectric, film thickness is in a range approximately from 0.2 to 2 microns.

More details on various etch approaches are the following:
Selective BARC opening Etch to stop on HM1 (3-5× Selectivity)—With the appropriate chemistry selection, etch front stops on HM1 layer among different structures across the whole wafer.
Selective HM1 Etch to stop on HM2
With the appropriate chemistry selection, etch front stops on HM2 layer among different structures across the whole wafer. Because of selective HM2 layer, trench depth as well as corner chopping is well controlled after this step.

Another etch approach is to process and etch the via-fill material, so as to recess this material, to minimize fence or sub-trench profiles. The timing of this step is adjusted to coincide with different Hard Mask etch and IMD etch chemistries. As this step uses photoresist strip gases, which have good selectivity to the bulk material, it only recesses the BARC inside the via, with minimum impact on the trench profile. After this step, BARC height inside the via recesses to about the same level of trench etch front. However, note that an accurate control of this step is critical. If this etch step is not sufficient, fencing will result, and if this etch step too much, sub-trenching will occur.

Key to the etch process is to utilize a 1:1 selectivity chemistry for the HM2, bottom hard mask, and IMD, inter-metal dielectric, film. Since the chemical properties of the HM2 materials are not much different from IMD film, a 1:1 selectivity chemistry can be used for etching HM2, as well as, for the IMD film. With this above methods, no fences or sub-trenches were observed in dense Trench & Via, Isolated Trench & Via, Open trench & dense via patterns.

Figure 2E:
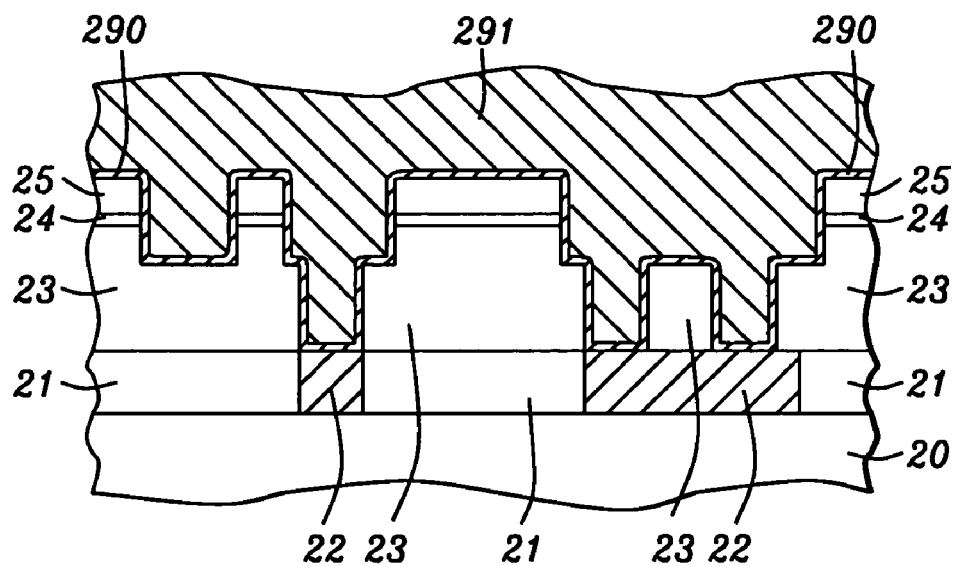
Figure 2F:
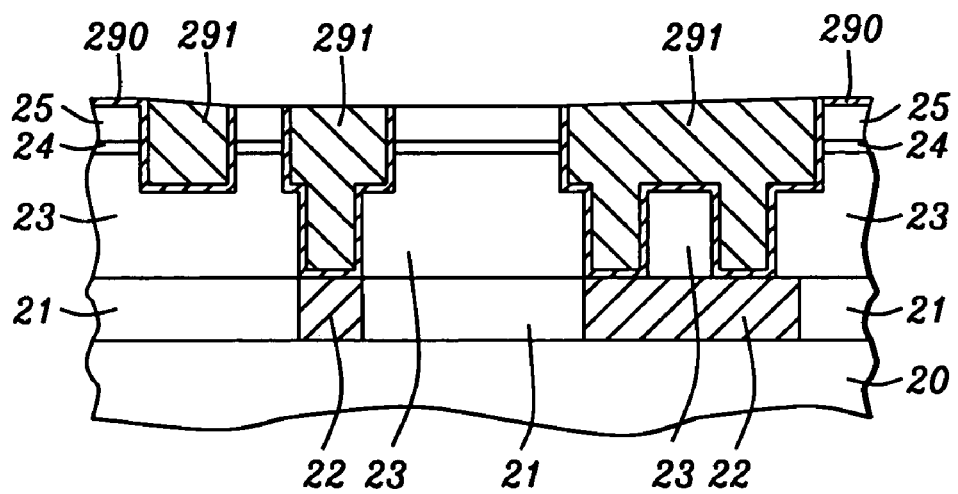

For completeness, the following is a detailed reactive ion etch, RIB, processing scheme for trench etch making use of the advantages of the bi-layer hard mask. This serves as just one example that was developed and reduced to practice, for RIE gas mixtures comprised of:
Step 1: $CF_4$ and Ar based for etching opening in the BARC, the bottom antireflection coating
Step 2: $CF_4$ $CHF_3$ with Ar for etching through the HM1, the top hard mask layer
Step 3: $N_2$ and $O_2$ for etching the via-fill material recess
Step 4: $CF_4$ and $N_2$ with $O_2$ for etching the HM2, the bottom hard mask layer, and the IMD, inter-metal dielectric
Step 5: $O_2$ for Ashing
Step 6: $CHF_3$ with $N_2$ for bottom etch stop layer etch Referring to FIGS. 2E-F, which illustrated in cross-sectional drawings, are the final processing steps in building of the dual damascene structure. In FIG. 2E, first is the deposition of a copper seed layer 290, which is then followed by an electrochemical copper deposition (ECD) 291 of excess copper. The copper seed layer 290, is thin copper, with thickness maximum of approximately 3,000 Angstroms. The conducting metal fill of electrochemically deposited copper 291 upon a copper seed layer, in the via and trench openings, has a thickness maximum of approximately 20,000 Angstroms, forming an excess of copper over the vias and trenches. In FIG. 2F, the final processing step in building of the dual damascene structure, is a chemical mechanical polishing (CMP) back of the excess electrochemical deposited copper metal 291, with the copper remaining inlaid in the trench and via regions. Polish, milling, ion milling, and/or etching are also methods of planarizing the excess copper. Furthermore, multilevel conducting structures are fabricating by repeating steps described above.

While the invention has been particularly shown and described with reference to the preferred embodiments thereof, it will be understood by those skilled in the art that various changes in form and details may be made without departing from the spirit and scope of the invention.

What is claimed is:

1. A method for fabricating IC's comprising the following steps:
   (a) providing a substrate with an insulating layer over the substrate;
   (b) providing a first level of conducting material defined and embedded in the insulating layer over the substrate;
   (c) depositing an intermetal dielectric layer over the insulating layer;
   (d) forming a bi-layered hard mask over the intermetal dielectric layer, the bi-layered hard mask comprising a first hard mask layer HM1 overlying a second hard mask layer HM2;
   (e) patterning the intermetal dielectric layer and hard mask layers, and $CF_4/N_2/O_2$ based reactive ion etching to form via openings extending through the intermetal dielectric layer and one of the hard mask layers;
   (f) forming a layer of via-fill material of bottom anti-reflective coating with photoresist over the intermetal dielectric layer, the via-fill material filling the via openings;
   (g) patterning the via-fill material, intermetal dielectric layer and hard mask layers, and etching to form trench openings using a reactive ion etch; and
   (h) stripping-off the via-fill material after forming the trench openings, thus forming open trench and open via regions for subsequent conducting metal fill.

2. The method of claim 1, wherein said substrate is semiconductor single crystal silicon or an IC module.

3. The method of claim 1, wherein said conducting material is metal wiring or contacts of Cu, AlCu alloys, AlCuSi alloys, W, polysilicon, silicide, or P-N junction diffusion regions.

4. The method of claim 1, wherein the insulating layer and intermetal dielectric layer are comprised of: silicon dioxide, silicon oxide, undoped silicate glass, Fluorine doped Oxide, Carbon-doped Oxide, Organic based low-k dielectric, or porous low-k dielectric, where the IMD, inter-metal dielectric, film thickness is in a range approximately from 0.2 to 2 microns.

5. The method of claim 1, wherein said bi-layered hard mask is comprised of:
   first hard mask layer HM1 of undoped silicate glass or $SiO_2$ film having a thickness in the range from 1000 to 2000 Angstroms; and
   second hard mask layer HM2 of silicon carbide or silicon nitride having an etch Selectivity of ~3-5 with respect to said first hard mask layer HM1 and having a thickness of between approximately 300 to 600 Angstroms.

6. The method of claim 1, wherein said photoresist is comprised of organic material, thickness ranges from thickness from 500 to 3,000 Angstroms, and etched forming trench openings using a reverse tone process.

7. The method of claim 1, wherein the intermetal dielectric layer and hard mask layers are etched to form trench openings by reactive ion etch, RIE, processing scheme for trench etch using the following RIE gas mixtures:
   Step 1: $CF_4$/Ar based for etching an opening in said via-fill material;
   Step 2: $CF_4$/CHF3/Ar based for HM1 etch;
   Step 3: $N_2/O_2$ based for etching via-fill material recess;
   Step 4: $CF_4$/N2/O2 based for etching HM2 and said intermetal dielectric;
   Step 5: $O_2$ based for Ashing; and
   Step 6: $CHF_3$ /$N_2$ based for bottom etch stop layer etch.

8. The method of claim 1, wherein multilevel structures are fabricating by repeating steps (b) through (h).

9. A method of fabricating an integrated circuit with a dual damascene process using a bi-layer hard mask, the method comprising the following steps:
   (a) providing a substrate with an insulating layer over the substrate;
   (b) providing a first level of conducting material defined and embedded in the insulating layer over the substrate;
   (c) depositing an intermetal dielectric layer over the insulating layer;
   (d) forming a bi-layered hard mask, two hard mask layers, over the intermetal dielectric layer, the bi-layered hard mask comprising a first hard mask layer HM1 overlying a second hard mask layer HM2;
   (e) patterning the intermetal dielectric layer and hard mask layers, and $CF_4/N_2/O_2$ based reactive ion etching to form via openings extending through the intermetal dielectric layer and one of the hard mask layers;
   (f) forming a layer of via-fill material of bottom anti-reflective coating with photoresist over the intermetal dielectric layer, the via-fill material filling the via openings;
   (g) patterning the via-fill material, intermetal dielectric layer and hard mask layers, and etching to form trench openings using a reactive ion etch;
   (h) stripping-off the via-fill material after forming the trench openings, forming open trench and open via regions;
   (i) depositing a copper seed layer in the trench openings and via openings;
   (j) forming an excess of copper metal over the copper seed layer; and
   (k) planarizing the excess copper back, thus forming inlaid copper in the trench and via openings for contact vias and interconnect wiring.

10. The method of claim 9, wherein said substrate is semiconductor single crystal silicon or an IC module.

11. The method of claim 9, wherein said conducting material is metal wiring or contacts of Cu, AlCu alloys, AlCuSi alloys, W, polysilicon, silicide, or P-N junction diffusion regions.

12. The method of claim 9, wherein the insulating layer and intermetal dielectric layer are comprised of: silicon dioxide, silicon oxide, undoped silicate glass, Huorine doped Oxide, Carbon-doped Oxide, Organic based low-k dielectric, or porous low-k dielectric, where the IMD, inter-metal dielectric, film thickness is in a range approximately from 0.2 to 2 microns.

13. The method of claim 9, wherein said bi-layered hard mask is comprised of:
   a first hard mask HM1 layer of undoped silicate glass or $SiO_2$ having a thickness in the range from 1000 to 2000 Angstroms; and
   a second hard mask layer HM2 of silicon carbide or silicon nitride having an etch Selectivity of ~3-5 with respect to said first hard mask layer HM1 and having a thickness of between approximately 300 to 600 Angstroms.

14. The method of claim 9, wherein said photoresist is comprised of organic material, thickness ranges from thickness from 500 to 3,000 Angstroms, and etched forming trench openings using a reverse tone process.

15. The method of claim 9, wherein the intermetal dielectric layer and hard mask layers are etched to form trench openings by reactive ion etch, RIE, processing scheme for trench etch using the following RIE gas mixtures:

Step 1: $CF_4$/Ar based for etching an opening in said via-fill material;
Step 2: $CF_4$/$CHF_3$/Ar based for HM1. etch;
Step 3: $N_2$/$O_2$ based for etching via-fill material recess;
Step 4: $CF_4$/$N_2$/$O_2$ based for etching of said HM2 and said intermetal dielectric;
Step 5: $O_2$ based for Ashing; and
Step 6: $CHF_3$/$N_2$ based for bottom etch stop layer etch.

16. The method of claim 9, further comprising depositing and defining a copper seed layer, in the via and trench openings, comprised of copper, with thickness maximum of approximately 3,000 Angstroms.

17. The method of claim 9, further comprising depositing a conducting metal fill of electrochemically deposited copper upon a copper seed layer, in the via and trench openings, with thickness maximum of approximately 20,000 Angstroms, forming an excess of copper over the vias and trenches.

18. The method of claim 9, further comprising planarizing an excess of copper over the vias and trenches by chemical mechanical polish, milling, ion milling, and/or etching, forming inlaid dual damascene conducting metal interconnects and contact vias in the vias and trenches.

19. The method of claim 9, wherein multilevel structures are fabricating by repeating steps (b) through (k).

20. A method of fabricating an integrated circuit with a dual damascene process for applications in MOSFET CMOS memory and logic devices, using a bi-layer hard mask, the method comprising the following steps:

(a) providing a substrate with an insulating layer over the substrate;
(b) providing a first level of conducting material defined and embedded in the insulating layer over the substrate;
(c) depositing an intermetal dielectric layer over the insulating layer;
(d) forming a bi-layered hard mask, two hard mask layers, over the intermetal dielectric layer, the bi-layered hard mask comprising a first hard mask layer HM1 overlying a second hard mask layer HM2;
(e) patterning the intermetal dielectric layer and hard mask layers, and $CF_4$/$N_2$/$O_2$ based reactive ion etching to form via openings extending through the intermetal dielectric layer and one of the hard mask layers;
(f) forming a layer of via-fill material of bottom anti-reflective coating with photoresist over the intermetal dielectric layer, the via-fill material filling the via openings;
(g) patterning the via-fill material, intermetal dielectric layer and hard mask layers, and etching to form trench openings using a reactive ion etch;
(h) stripping-off the via-fill material after forming the trench openings, forming open trench and open via regions;
(i) depositing a copper seed layer in the trench openings and via openings;
(j) forming an excess of copper metal over the copper seed layer; and
(k) planarizing the excess copper back, thus forming inlaid copper in the trench and via openings for contact vies and interconnect wiring.

21. The method of claim 20, wherein said substrate is semiconductor single crystal silicon or an IC module.

22. The method of claim 20, wherein said conducting material is metal wiring or contacts of Cu, AlCu alloys, AlCuSi alloys, W, polysilicon, silicide, or P-N junction diffusion regions.

23. The method of claim 20, wherein the insulating layer and intermetal dielectric layer are comprised of: silicon dioxide, silicon oxide, undoped silicate glass, Fluorine doped Oxide, Carbon-doped Oxide, Organic based low-k dielectric, or porous low-k dielectric, where the IMD intermetal dielectric, film thickness is in a range approximately from 0.2 to 2 microns.

24. The method of claim 20, wherein said bi-layered hard mask is comprised of:

a first hard mask layer HM1 of undoped silicate glass or $SiO_2$ having a thickness in the range from 1000 to 2000 Angstroms; and
a second hard mask layer HM2 of silicon carbide or silicon nitride having an etch Selectivity-of ~3-5 with respect to said first hard mask layer HM1 and having a thickness of between approximately 300 to 600 Angstroms.

25. The method of claim 20, wherein said photoresist is comprised of organic material, thickness ranges from thickness from 500 to 3,000 Angstroms, and etched forming trench openings using a reverse tone process.

26. The method of claim 20, wherein the intermetal dielectric layer and hard mask layers are etched to form trench openings by reactive ion etch, RIE, processing scheme for trench etch using the following RIE gas mixtures:

Step 1: $CF_4$/Ar based for etching an opening in said via-fill material;
Step 2: $CF_4$/$CHF_3$/Ar based for HM1 etch;
Step 3: $N_2$/$O_2$ based for etching via-fill material recess;
Step 4: $CF_4$/$N_2$/$O_2$ based for etching said HM2 and said intermetal dielectric;
Step 5: $O_2$ based for Ashing; and
Step 6: $CHF_3$/$N_2$ based for bottom etch stop layer etch.

27. The method of claim 20, further comprising depositing and defining a copper seed layer, in the via and trench openings, comprised of copper, with thickness maximum of approximately 3,000 Angstroms.

28. The method of claim 20, further comprising depositing a conducting metal fill of electrochemically deposited copper upon a copper seed layer, in the via and trench openings, with thickness maximum of approximately 20,000 Angstroms, forming an excess of copper over the vias and trenches.

29. The method of claim 20, further comprising planarizing an excess of copper over the vias and trenches by chemical mechanical polish, milling, ion milling, and/or etching, forming inlaid dual damascene conducting metal interconnects and contact vias in the vias and trenches.

30. The method of claim 20, wherein multilevel structures are fabricating by repeating steps (b) through (k).

* * * * *